(12) United States Patent
Schrems et al.

(10) Patent No.: US 7,067,372 B2
(45) Date of Patent: Jun. 27, 2006

(54) METHOD FOR FABRICATING A MEMORY CELL HAVING A TRENCH

(75) Inventors: Martin Schrems, Eggersdorf B. Graz (AT); Rolf Weis, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/657,929

(22) Filed: Sep. 9, 2003

(65) Prior Publication Data

US 2004/0079990 A1    Apr. 29, 2004

Related U.S. Application Data

(63) Continuation of application No. PCT/DE02/00596, filed on Feb. 19, 2002.

(30) Foreign Application Priority Data

Mar. 9, 2001 (DE) .................. 101 11 499

(51) Int. Cl.
*H01L 21/8242* (2006.01)
(52) U.S. Cl. .................. 438/245; 438/242; 438/388
(58) Field of Classification Search ................ 438/242, 438/245, 388
See application file for complete search history.

(56) References Cited

U.S. PATENT DOCUMENTS

| | | | |
|---|---|---|---|
| 5,100,823 A | 3/1992 | Yamada | |
| 5,208,657 A | 5/1993 | Chatterjee et al. | |
| 5,559,350 A | 9/1996 | Ozaki et al. | |
| 5,641,694 A * | 6/1997 | Kenney | 438/156 |
| 5,744,386 A | 4/1998 | Kenney | |
| 6,333,533 B1* | 12/2001 | Furukawa et al. | 257/301 |
| 6,653,229 B1* | 11/2003 | Cox | 438/637 |
| 2001/0030337 A1 | 10/2001 | Weis | |
| 2003/0034512 A1 | 2/2003 | Cappelani et al. | |

FOREIGN PATENT DOCUMENTS

| | | |
|---|---|---|
| DE | 199 11 143 C1 | 5/2000 |
| DE | 100 45 694 A1 | 4/2002 |
| EP | 0 997 947 A1 | 5/2000 |
| EP | 1 011 138 A2 | 6/2000 |
| EP | 1 132 958 A2 | 9/2001 |

OTHER PUBLICATIONS

Wolf, S., et al., "Silicon Processing for the VLSI Era vol. 1: Process Technology", 1986, Lattice Press, vol. 1, p. 142.*
Author not listed: "Vertical DRAM Cell Structure Using Vertical Transistor in the Trench Capacitor", IBM Technical Disclosure Bulletin, IBM Corp., vol. 33, No. 3A, Aug. 1990, pp. 72-75.

* cited by examiner

*Primary Examiner*—Howard Weiss
(74) *Attorney, Agent, or Firm*—Laurence A. Greenberg; Werner H. Stemer; Ralph E. Locher

(57) ABSTRACT

A memory cell has a trench, in which a trench capacitor is disposed. Furthermore a vertical transistor is formed in the trench above the trench capacitor. A barrier layer is disposed for the electric connection of the conductive trench filling to a lower doping region of the vertical transistor. The barrier layer is a diffusion barrier for dopants or impurities that are contained in the conductive trench filling.

18 Claims, 15 Drawing Sheets

METHOD FOR FABRICATING A MEMORY CELL HAVING A TRENCH

CROSS-REFERENCE TO RELATED APPLICATION

This application is a continuation of copending International Application No. PCT/DE02/00596, filed Feb. 19, 2002, which designated the United States and was not published in English.

BACKGROUND OF THE INVENTION

Field of the Invention

The present invention relates to a memory cell having a trench, which is formed in a substrate. The trench is suitable for disposing a trench capacitor and a vertical selection transistor above the trench capacitor in the trench.

Memory devices, such as dynamic random access memories (DRAMs), for example, contain a cell array and an addressing periphery, individual memory cells being disposed in the cell array.

A DRAM chip contains a matrix of memory cells that are disposed in the form of rows and columns and are addressed by word lines and bit lines. Data are read from the memory cells or data are written to the memory cells by the activation of suitable word lines and bit lines.

A DRAM memory cell usually contains a transistor connected to a capacitor. The transistor contains, inter alia, two diffusion regions that are isolated from one another by a channel controlled by a gate. Depending on the direction of the current flow, one diffusion region is referred to as the drain region and the other diffusion region is referred to as the source region.

One of the diffusion regions is connected to a bit line, the other diffusion region is connected to the capacitor and the gate is connected to a word line. By applying suitable voltages to the gate, the transistor is controlled in such a way that a current flow between the diffusion regions through the channel is switched on and off.

The integration density is being continuously increased by the advancing miniaturization of memory devices. The continuous increase in the integration density results in that the area available per memory cell decreases ever further. In order to effectively utilize the available area, the selection transistor can be formed as a vertical transistor in a trench above a trench capacitor. A generic memory cell having a trench capacitor and a vertical transistor is disclosed in U.S. Pat. No. 5,744,386. Further explanations regarding trench capacitors or transistors are described in U.S. Pat. No. 5,208,657. However, in the variants disclosed in the prior art, there is the problem of connecting the gate of the vertical transistor to a word line and of connecting the drain contact of the vertical transistor to a bit line. With advancing miniaturization, the requirements imposed on these two connections with regard to alignment accuracy will increase further. A further problem of the variants disclosed in the prior art is that dopants diffuse from the highly doped conductive trench filling of the trench capacitor which forms the inner capacitor electrode, upwards into the region of the vertical transistor and into the channel region of the vertical transistor, thereby rendering the transistor unusable.

SUMMARY OF THE INVENTION

It is accordingly an object of the invention to provide a memory cell having a trench and a method for fabricating the memory cell that overcome the above-mentioned disadvantages of the prior art devices and methods of this general type, which improved memory cell has a trench and an epitaxially grown layer which avoids a dopant diffusion.

With the foregoing and other objects in view there is provided, in accordance with the invention, a memory cell. The memory cell contains a substrate having a trench formed therein. The trench has a lower region, a central region, an upper region and an inner wall. The lower region is disposed below the central region, and the central region is disposed below the upper region. An insulation collar is disposed in the central region on the inner wall of the trench. A dielectric layer is disposed in the lower region of the trench. A conductive trench filling is disposed in the lower region and the central region of the trench. An epitaxially grown layer is disposed in the upper region of the trench on the inner wall of the trench. A barrier layer is disposed between the conductive trench filling and the epitaxially grown layer and covers completely the conductive trench filling.

The advantage of the barrier layer disposed between the conductive trench filling and the epitaxially grown layer relates in its action as a diffusion barrier against dopants or metals and other materials that are present in the conductive trench filling. The barrier layer is advantageously formed in such a way that it represents a barrier for the materials but not for the electric charge stored in the trench capacitor.

An advantageous refinement of the configuration according to the invention provides for a second dielectric layer with an inner opening to be disposed in the upper region of the trench above the epitaxially grown layer. The advantage of the second dielectric layer is that a gate terminal from a word line to the gate electrode of the vertical transistor can be formed in a self-aligned manner with the aid of the second dielectric layer. In this case, the second dielectric layer serves as a mask for etching free the gate electrode in the course of the connection to the word line. This has the advantage that only significantly less stringent alignment tolerances have to be complied with, which affords the possibility of advancing the miniaturization process further.

A further advantage is that, for more efficient utilization of the existing area, the trench can be made wider than the contacts and wider than the word line, since the etching process automatically etches free the inner opening in the second dielectric layer. Smaller safety margins and a word line layout that saves more space are thus possible.

Furthermore, the object set is achieved by a method for fabricating a memory cell. The method has the step of forming a trench in a substrate, which has a lower region, a central region, an upper region and an inner wall. Subsequently an insulation collar is formed in the central region on the inner wall of the trench and a dielectric layer is formed at least in the lower region of the trench. A conductive trench filling is provided in the lower region of the trench on the dielectric layer and at least partly in the central region of the trench on the insulation collar. A barrier layer is formed on the conductive trench filling and a layer is epitaxially grown in the upper region of the trench, on the inner wall of the trench and on the conductive trench filling.

In an advantageous refinement of the method according to the invention, it is provided that a second dielectric layer with an inner opening is formed in the upper region of the trench above the epitaxially grown layer. The advantage of the second dielectric layer with the inner opening is that a gate terminal from a word line to a gate electrode of the vertical transistor can be formed in a self-aligned manner with the aid of the second dielectric layer.

A further advantageous method step is that during the epitaxial growth of the layer, the barrier layer is overgrown laterally—proceeding from the inner wall of the trench. This reduces mechanical stresses in the epitaxially grown layer, since the latter can slide on the barrier layer.

A further advantageous refinement of the invention provides for a closing joint to be formed in the layer, the closing joint being annealed by a thermal step at a temperature of between 900 and 1200° C. As an alternative, the annealing step can be carried out in ultrahigh vacuum (UHV) at a pressure of between $10^{-5}$ and $10^{-10}$ torr, preferably at $10^{-9}$ torr, and a temperature of between 400° C. and 900° C., preferably at 500° C. The thermal annealing step is likewise referred to as a reflow step and, on the one hand, leads to mechanical stresses of the epitaxially grown layer being reduced and, on the other hand, leads to the closing joint being annealed.

A further advantageous instance of the method according to the invention provides for a second trench to be formed in the epitaxially grown layer and a dielectric layer to be formed on a sidewall of the second trench. In this configuration, the dielectric layer is a gate oxide. It is advantageous in this case that the gate oxide is produced on the epitaxially grown layer and insulates the channel of the transistor from a gate electrode.

One method variant provides for the second trench to be formed as far as the barrier layer.

A further method variant provides for a trench bottom insulation to be formed in the second trench on the barrier layer.

Furthermore, it is advantageous that an isolation trench is disposed in such a way that it surrounds the memory cell and an adjacent memory cell and an active region is formed between the memory cell and the adjacent memory cell, the active region being doped. By this configuration, two adjacent memory cells are connected to an active region on which a bit line contact can later be formed.

Furthermore, it is advantageous that the channel region of the vertical transistor is not insulated, as would be the case with an silicon-on-insulator (SOI) transistor. The bulk terminal improves the control behavior of the vertical transistor and the latter can be put into an off state again by a suitable gate voltage. Furthermore, the isolation trench has the task of insulating the memory cell and the adjacent memory cell from the remaining memory cells, thereby reducing leakage currents.

A further advantageous configuration of the invention provides for the epitaxially grown layer to have a lower doped region, which is connected to the conductive trench filling, and an upper doped region, which is connected to the active region. The doped regions form the source region and the drain region of the vertical transistor.

A further advantageous embodiment of the invention provides for a bit line to run over the active region and make contact with the active region. In this case, the bit line is led in sections over the isolation trench and in sections over the active region, contact thereby being made with the latter. The bit line has a low line capacitance as a result of this configuration, which is particularly advantageous when reading from a memory cell, since the ratio of bit line capacitance to the memory cell capacitance should be as small as possible during read-out, in order that the charge stored in the memory cell is able to reverse the charge of the bit line and generate a signal in the sense amplifier. Furthermore, the bit line can be formed from a low-resistance material, as a result of which the memory cell is fast.

A further advantageous embodiment of the invention relates to the encapsulation of the bit line in a dielectric encapsulation. The dielectric encapsulation can be used as a self-aligning etching mask during the etching of a contact hole for the gate terminal and thus improve the alignment tolerance of the memory cell.

A further advantageous instance of the invention provides for a gate electrode to be disposed on the third dielectric layer and to reach at least as far as the inner opening of the second dielectric layer. Furthermore, it is provided that a gate terminal is disposed on the gate electrode and extends through the inner opening of the second dielectric layer and through a glass layer (this may be a doped borophosphorus silicate glass) as far as a word line, which may be disposed on the glass layer. This configuration ensures that the gate electrode can be connected to a word line through the inner opening of the second dielectric layer. Furthermore, it is advantageously possible to form the gate terminal in a self-aligned manner.

A further advantageous instance of the invention provides the word line to run above the bit line. This configuration enables a low coupling capacitance between the bit line and the word line which is advantageously manifested when reading from the memory cell by virtue of little crosstalk from the word line to the bit line. Furthermore, the total bit line capacitance is reduced as a result, which increases the speed of the memory cell and increases the read-out reliability.

A further advantageous instance of the invention provides for a circuit periphery to have transistors having gate electrodes and the gate electrodes to be formed in one process step with the bit line. The combination of fabrication steps in the circuit periphery, which contains the addressing logic for the memory cell array, with fabrication steps for layers and structures in the cell array makes it possible to lower the fabrication costs for a memory. Therefore, it is very effective to fabricate the gate electrodes of the transistors of the circuit periphery in one step with the bit line in the cell array.

A further advantageous memory cell provides for the configuration, beside the trench, of further trenches in a hexagonal pattern or near hexagonal pattern. This configuration has the advantage that the available surface can be optimally utilized since a hexagonal configuration of the trenches represents the largest packing density in a two-dimensional configuration. As a result, each individual trench can be disposed in such a way that it is spaced equally from its nearest adjacent trenches.

Other features which are considered as characteristic for the invention are set forth in the appended claims.

Although the invention is illustrated and described herein as embodied in a memory cell having a trench and a method for fabricating the memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2A:
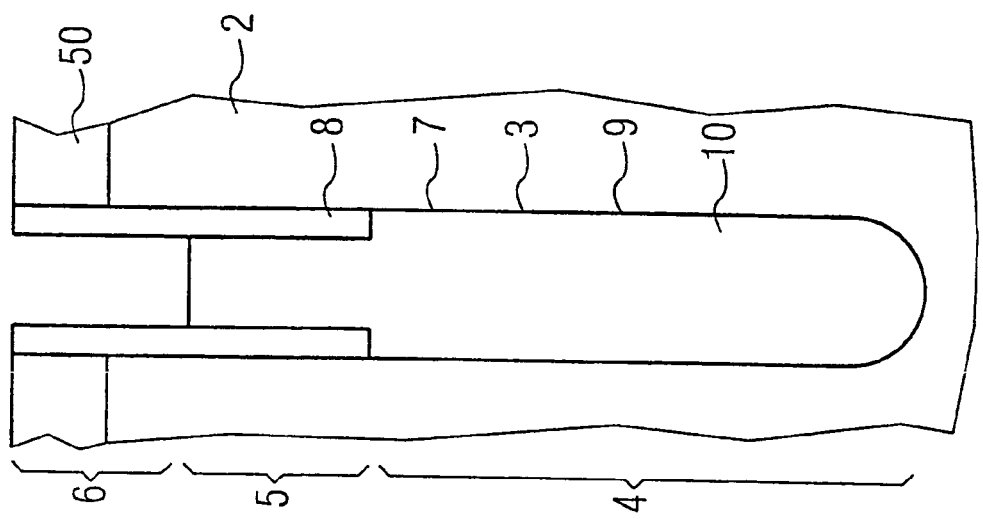
FIGS. 2A, 3A, 4A, 5A, and 6A are sectional views showing successive fabrication steps of the memory cell proceeding from FIG. 1.

In the figures identical reference symbols designate identical or functionally identical elements. Referring now to the figures of the drawing in detail and first, particularly, to FIG. 1 thereof, there is shown a memory cell 1 containing a trench 3, which is formed in a substrate 2. In the exemplary embodiment, the substrate 2 is composed of silicon that may be doped with boron, phosphorus or arsenic. The trench 3 has a lower region 4, a central region 5 and an upper region 6. Furthermore, the trench 3 has an inner wall 7. In the central region 5 and the upper region 6 of the trench 3, an insulation collar 8 is disposed on the inner wall 7. The insulation collar 8 is usually composed of silicon oxide. Furthermore, a hard mask 50 is situated on the substrate 2 and serves as an etching mask for the etching of the trench 3. The hard mask 50 is formed from silicon nitride, for example. The inner wall 7 of the trench 3 is lined with a dielectric layer 9 in the lower region 4 of the trench 3. Furthermore, the dielectric layer 9 may optionally be situated in the central region 5 and in the upper region 6 on the insulation collar 8 or under the insulation collar 8, that is to say on the inner wall 7 of the trench. In addition, the trench 3 is filled with a conductive trench filling 10. The conductive trench filling 10 contains, for example, doped silicon, a metal silicide, a metal nitride or a metal which may contain the elements titanium, tantalum, tungsten, cobalt, nickel and molybdenum. The conductive trench filling 10 serves as an inner capacitor electrode and the substrate 2 serves as an outer capacitor electrode. The capacitor dielectric is formed by the dielectric layer 9.

Figure 1:
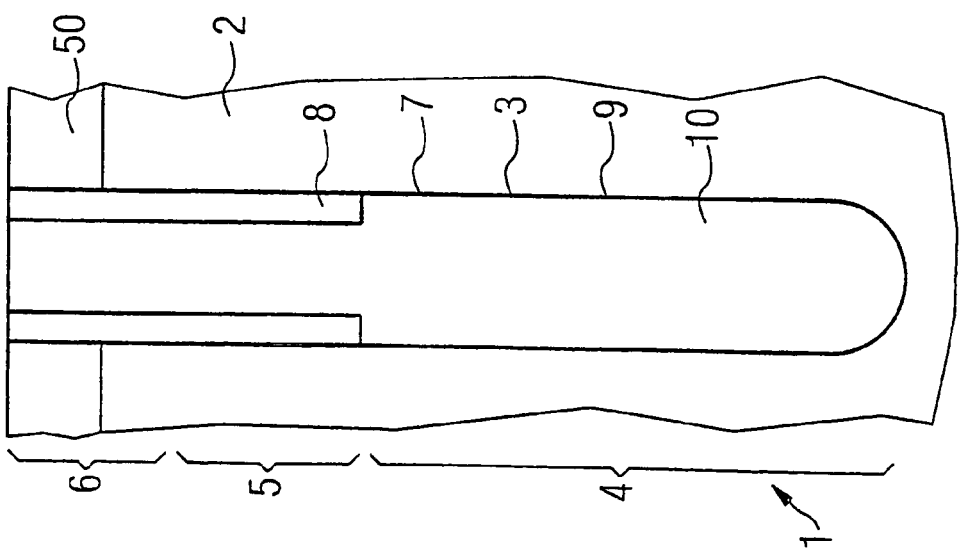
FIG. 1 is a diagrammatic, sectional view of a trench capacitor according to the invention.

A fabrication method for forming the memory cell illustrated in FIG. 1 includes the deposition of the hard mask 50 on the substrate 2, the hard mask 50 usually being formed from silicon nitride. By way of example, a low-pressure chemical vapor deposition (LPCVD) method is used for fabricating the hard mask 50. The hard mask 50 is subsequently patterned by photolithography and etching and used as an etching mask for the etching of the trench 3. After the etching of the trench 3, the latter is lined with the dielectric layer 9. The dielectric layer 9 is usually composed of a silicon oxide, silicon nitride or an oxynitride that is formed by thermal and by CVD methods. In a subsequent method step, the insulation collar 8 is formed in the central and upper regions 5, 6 of the trench 3.

The substrate 2 is usually formed from monocrystalline silicon. The insulation collar 8 is formed from a silicon oxide that is applied by a CVD process, for example. In this exemplary embodiment, the conductive trench filling 10 is composed of a highly doped polysilicon and is likewise filled into the trench by a CVD process.

Figure 2:
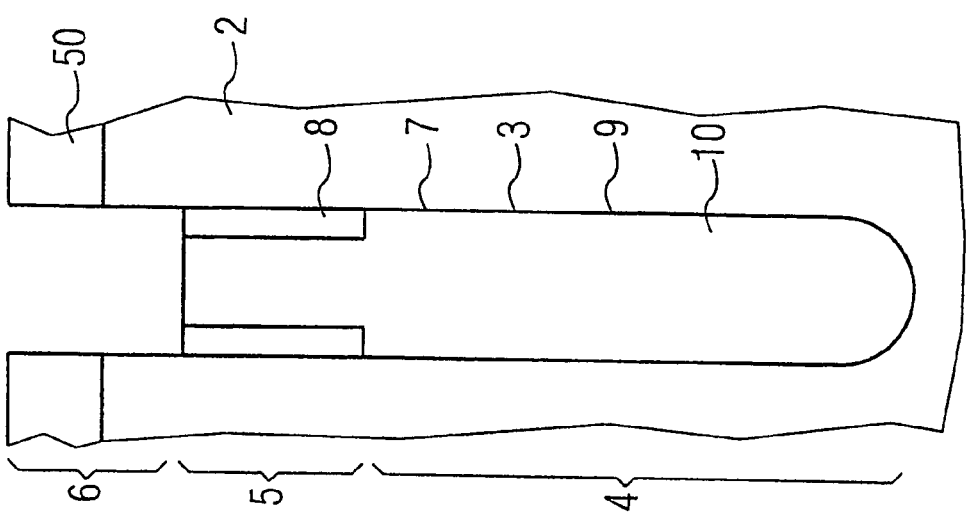
FIGS. 2, 3, 4, 5 and 6 are sectional views showing successive fabrication steps of a memory cell proceeding from FIG. 1.

With reference to FIG. 2, the conductive trench filling 10 and the insulation collar 8 are sunk, so that they are removed from the upper region 6 of the trench 3. If optionally provided, as shown in the exemplary embodiment, the dielectric layer 9 initially remains in the upper region 6 of the trench 3, since the sinking process which sinks the conductive trench filling 10 and the insulation collar 8 is selective with respect to the nitride-containing dielectric layer 9. The sinking process is carried out by an etching-back method.

Figure 3:
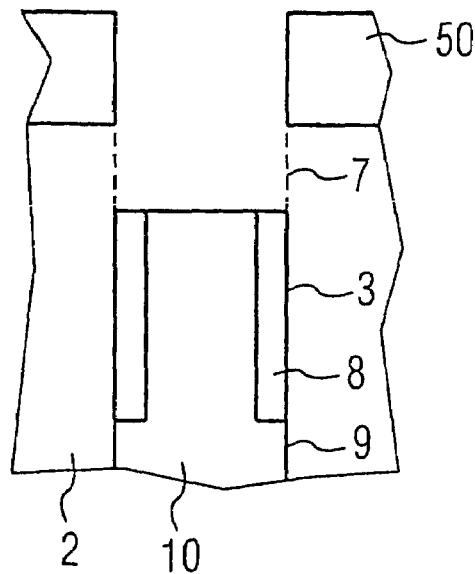

With reference to FIG. 3, in a subsequent step, the optionally present dielectric layer 9 is removed from the upper region 6 of the trench 3. As a result of this method step, the substrate 2 is uncovered at the inner wall 7 in the upper region 6 of the trench 3.

Figure 4:
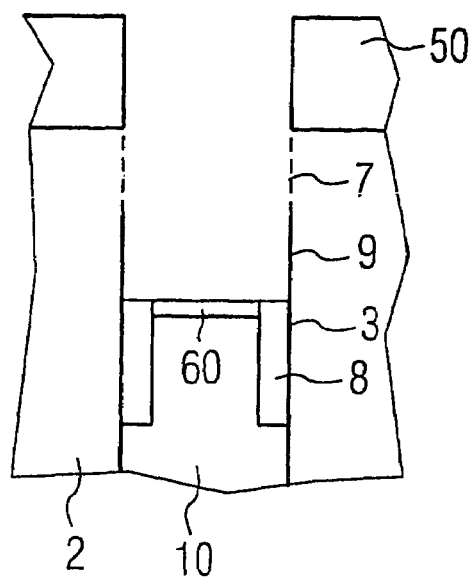

With reference to FIG. 4, a further sinking process is optionally carried out completely or partly, in the course of which the conductive trench filling 10 and the insulation collar 8 are partially removed from the upper region 6 and the central region 5 of the trench 3. Once again the dielectric layer 9, if present, remains on the inner wall 7 of the trench in the upper region 6 and the central region 5, since the conductive trench filling 10 and the insulation collar 8 are removed selectively with respect to the dielectric layer 9. A barrier layer 60 is subsequently formed on the conductive trench filling 10. The barrier layer 60 has the advantage that dislocations from the conductive trench filling 10 do not migrate into the epitaxial layer 11 that is grown later. Dislocations could lead to a selection transistor of a memory cell not turning off and considerable leakage currents flowing through it, which discharge the storage capacitor in a short time. The barrier layer 60 is formed from a nitride or oxide-containing material, for example. One method variant provides for a thermal nitride, a thermal oxide or a thermal oxynitride to be formed on the conductive trench filling 10. In order to form a thermal nitride, by way of example the configuration is exposed to a nitrogen or ammonia-containing atmosphere in a process chamber for approximately 30 minutes at a temperature of between 600 and 1000° C. A thermally grown silicon nitride layer having a thickness of between 0.5 to 2 nm is produced as barrier layer 60 in the process. The barrier layer 60 furthermore has the advantage that it serves as a diffusion barrier for dopants, metals and impurities that are contained in the conductive trench filling 10.

Suitable further materials for the barrier layer 60 are silicides such as titanium silicide, cobalt silicide and tungsten silicide and metals and metal compounds such as tungsten, tungsten nitride and titanium nitride. These materials likewise allow a selective epitaxy process, the selective epitaxy not growing on the tungsten nitride or titanium nitride, but rather growing laterally—proceeding from the inner wall 7 of the trench 3.

The formation of the barrier layer 60 from a silicide layer can be carried out e.g. by carrying out the formation of a metal layer having a thickness of 10 to 40 nm from e.g. titanium or tungsten by a chemical vapor deposition (CVD) or a physical vapor deposition (PVD) process. A siliciding step is subsequently carried out in a nitrogen-containing atmosphere at a temperature of approximately 700° C. for a time duration of between 10 and 60 seconds. In the process, the deposited metal layer reacts with silicon disposed beneath it to form a silicide. The rest of the metal remains—without entering into a compound—on a layer made of e.g. silicon oxide or silicon nitride. Afterwards the metal is removed by a cleaning step using $H_2O/NH_4OH/H_2O_2$ in the ratio 5/1/1 at approximately 65° C. (Hot Huang A). This may optionally be followed by a further thermal step at temperatures around approximately 850° C. in a nitrogen-containing atmosphere in order to improve the conductivity of the silicide layer. A subsequent cleaning step can be carried out using Huang A B (SC1/SC2) for removing particles and impurities.

By way of example, the barrier layer 60 may be formed by doping. If the conductive trench filling 10 is composed e.g. of polycrystalline silicon, then nitrogen, tungsten or carbon may be introduced as dopant into the conductive trench filling and form the barrier layer 60. The doping can be carried out e.g. by plasma doping or ion implantation at an acceleration energy of less than 1 keV. This corresponds to ultra low energy (ULE) ion implantation for forming very shallow doping regions.

Figure 5:
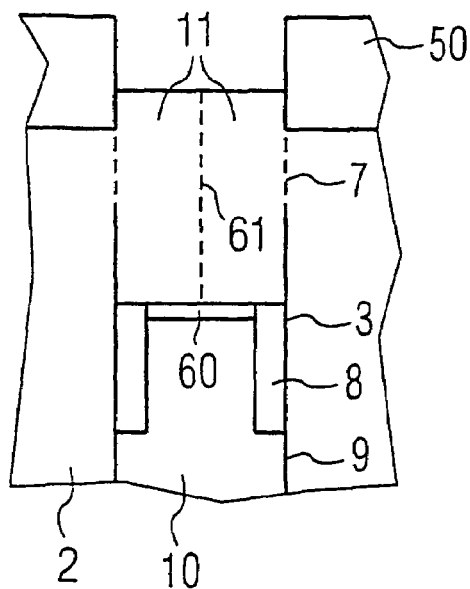

With reference to FIG. 5, an epitaxially grown layer 11 is grown in an epitaxy step in the upper region 5 and in the central region 6 of the trench 3. In this case, the epitaxially grown silicon grows on silicon that is already present. Since the conductive trench filling 10 is covered by the barrier layer 60, the epitaxially grown silicon grows laterally proceeding from the inner wall 7 of the trench 3 in a ring-like structure, a closing joint 61 being produced where different growth fronts of the epitaxially grown silicon layer meet one another. Before the growth process, a hydrogen prebake may be carried out at approximately 900° C. and approximately 20 torr. In this case, the surface of a silicon layer is cleaned, e.g. silicon oxide being removed. The epitaxial layer can be grown e.g. at 900° C. using the precursor gases $SiH_2Cl_2/HCl/H_2$ with the flow rates 180 sccm/120 sccm/10 slm at a pressure of 15 torr.

In order to reduce mechanical stresses around edges, reflow steps are used during the growth of the epitaxial layer. A reflow process is carried out for example in a process chamber under a hydrogen atmosphere at a temperature of between 900° C. and 1100° C., preferably 1050° C., and an $H_2$ gas flow of 15 slm for a time duration of between 10 and 60 seconds.

The epitaxial layer may optionally be grown in UHV at approximately 500° C. using silan or $Si_2H_6$ as precursor. In this case, a pressure of between $10^{-3}$ and $10^{-7}$ is suitable and a pressure of $10^{-5}$ torr is preferred. The annealing step (reflow) can correspondingly be carried out in UHV at approximately $10^{-9}$ torr. It is advantageous to use low temperatures around 500° C. since this contains a smaller temperature budget, thereby enabling the use of a capacitor dielectric having a high dielectric constant in the trench capacitor. The reflow enables the epitaxially grown layer to flow, the monocrystalline structure of the epitaxially grown layer being preserved.

It is optionally possible for the process steps for the epitaxial growth of a silicon layer and the annealing (reflow) of the epitaxially grown silicon layer to be repeated as often as desired in order to fabricate an epitaxially grown silicon layer without a closing joint with a desired thickness.

An epitaxial layer with a thickness of half the trench diameter is required for filling the upper region 6 of the trench 3 with the epitaxially grown layer 11. Consequently, a selectively grown silicon epitaxial layer having a thickness of 10 to 100 nm is required depending on the cross section of the trench 3. By use of the growth process specified above, the closing joint 61 is avoided and a monocrystalline silicon block is produced above the conductive trench filling 10. The block is connected to the substrate 2 via the inner wall 7 of the trench 3 seamlessly and in a manner free from dislocations. The vertical transistor is subsequently fabricated in the silicon block.

Figure 6:
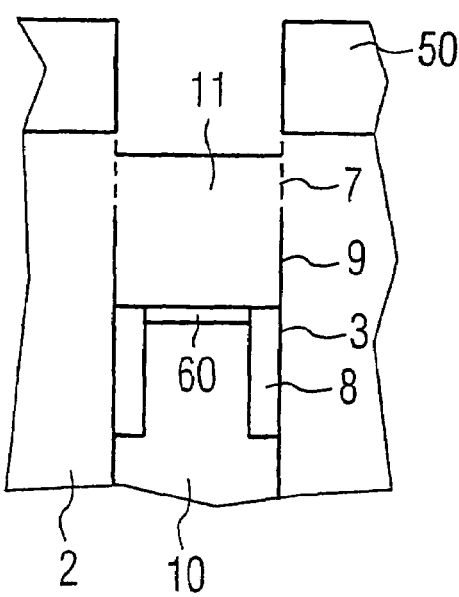

FIG. 6 illustrates the barrier layer 60 on the conductive trench filling 10. Disposed on the barrier layer 60 is the monocrystalline silicon block 11 that is grown epitaxially.

FIG. 2A illustrates a method variant in which only the conductive trench filling 10 is sunk and the insulation collar 8 remains.

Figure 3A:
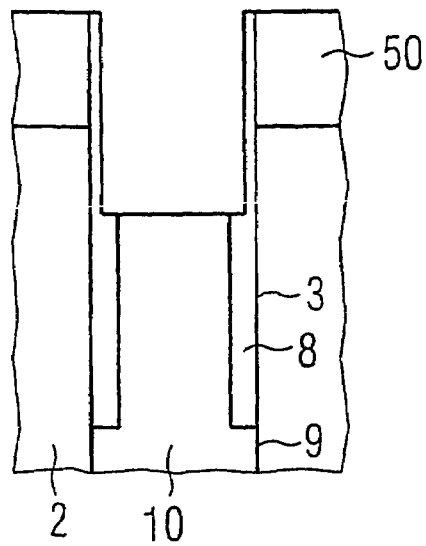
Figure 4A:
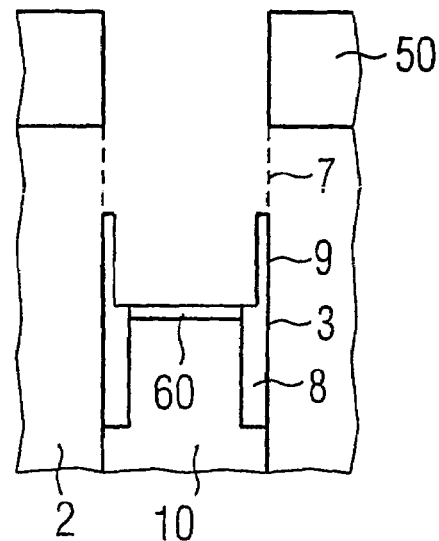

A partial widening of the isolation trench is illustrated with reference to FIG. 3A. If the insulation collar has a thickness of approximately 40 nanometres, then approximately 30 nm are removed, which is carried out by wet-chemical etching, for example. With reference to FIG. 4A, the conductive trench filling 10 is sunk again and the barrier layer 60 is formed, as described e.g. in connection with FIG. 4. The insulation collar 8 is etched conformally, the inner wall 7 of the trench 3 being partly uncovered. The insulation collar 8 remains in part above the barrier layer 60 in thinned form.

Figure 5A:
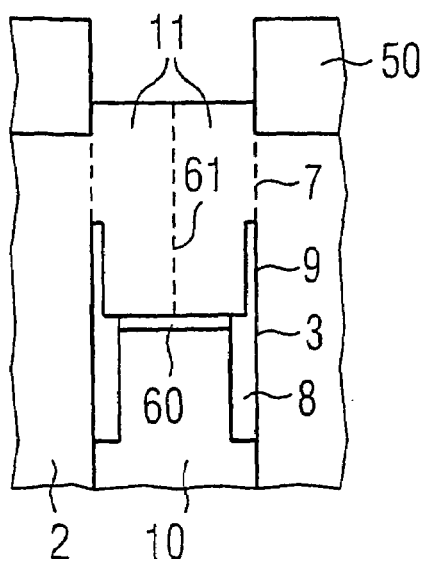

In accordance with FIG. 5A, the epitaxially grown layer 11 is subsequently formed, as described in connection with FIG. 5.

Figure 6A:
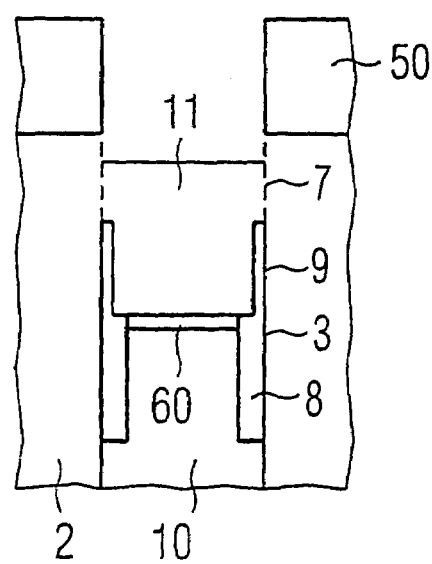

Afterwards, in accordance with FIG. 6A, a sinking process is carried out, which is performed in accordance with the description relating to FIG. 6.

Figure 3B:
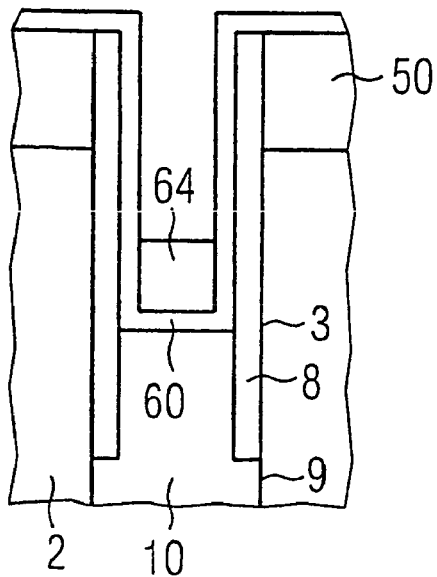
FIGS. 3B and 4B are sectional views showing successive fabrication steps of the memory cell proceeding from FIG. 2.

A further method variant, which proceeds from FIG. 2A, is illustrated in FIG. 3B. The insulation collar 8 initially remains in its entirety in the trench 3 and the conductive trench filling 10 is sunk more deeply. Afterwards, the barrier layer 60 is deposited over the whole area and a resist filling 64 is filled into the trench and sunk.

Figure 4B:
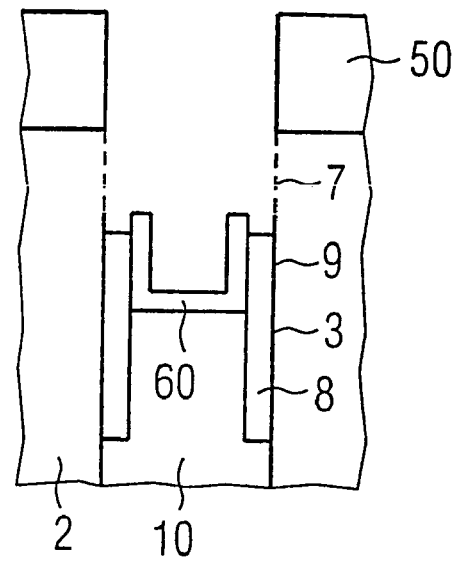

With reference to FIG. 4B, the barrier layer is removed from the surface of the hard mask 50 and remains in the trench 3 where the barrier layer 60 is protected from etching with the resist filling 64. Afterwards, the insulation collar 8 is removed from the sidewall 7 of the trench 3. In this case, the barrier layer 60 is formed such that it is U-shaped or cup-shaped in section. Afterwards, the method steps in accordance with FIG. 5 and following are carried out.

Figure 3C:
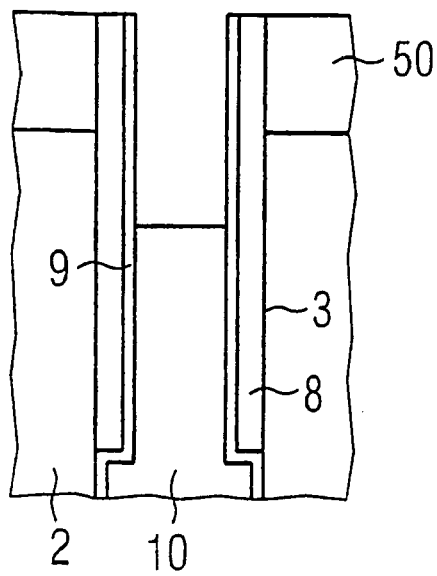
FIGS. 3C, 3D, 3E, 3F, 3G, 3H and 3I are sectional views showing successive fabrication steps of the memory cell proceeding from FIG. 2.

A further method variant in accordance with FIG. 3C forms the dielectric layer only after the formation of the isolation trench. The trench is subsequently filled with the conductive trench filling, which is sunk in the upper region 6 of the trench 3.

Figure 3D:
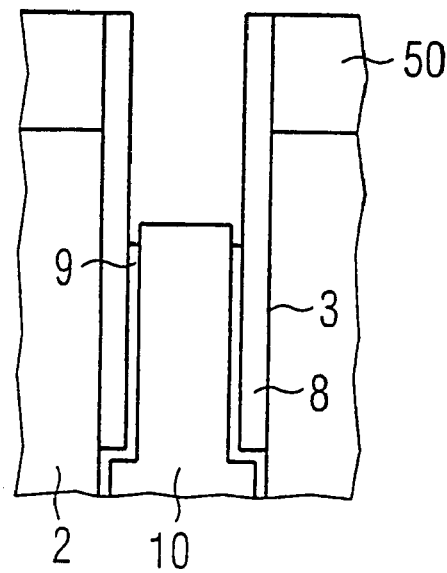

In accordance with FIG. 3D, the dielectric layer 9 is subsequently removed from the insulation collar 8 selectively in the upper region 6, e.g. by wet-chemical etching.

Figure 3E:
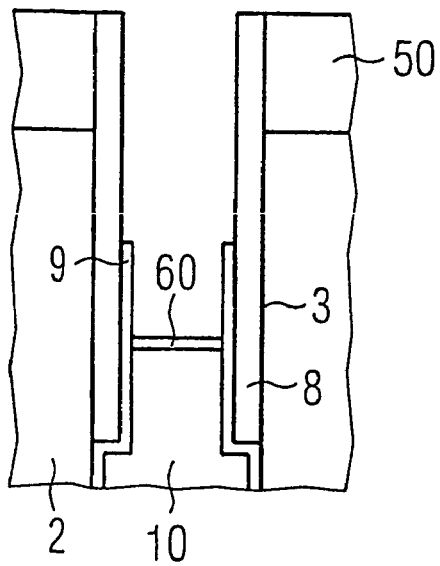

With reference to FIG. 3E, the conductive trench filling 10 is sunk again and the barrier layer 60 is then formed.

Figure 3F:
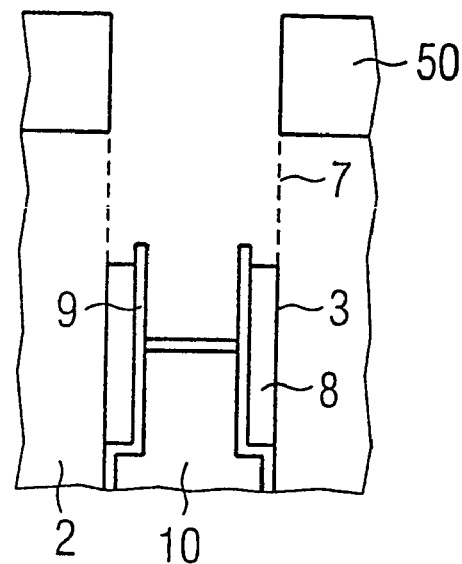

In accordance with FIG. 3F, the insulation collar 8 is removed from the upper region 6 and the inner wall 7 of the trench 3 is uncovered.

Figure 3G:
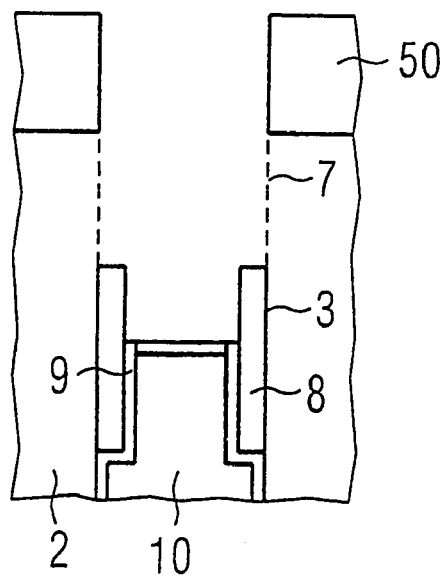

The illustration in FIG. 3G shows that the dielectric layer 9 has been removed from the insulation collar 8, which can be carried out e.g. by wet-chemical etching.

Figure 3H:
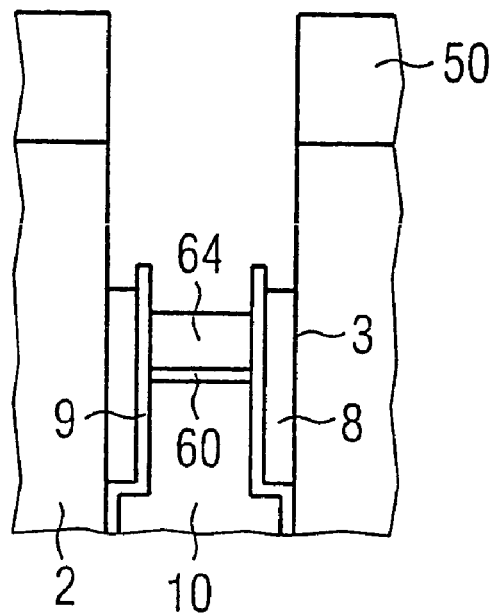
Figure 3I:
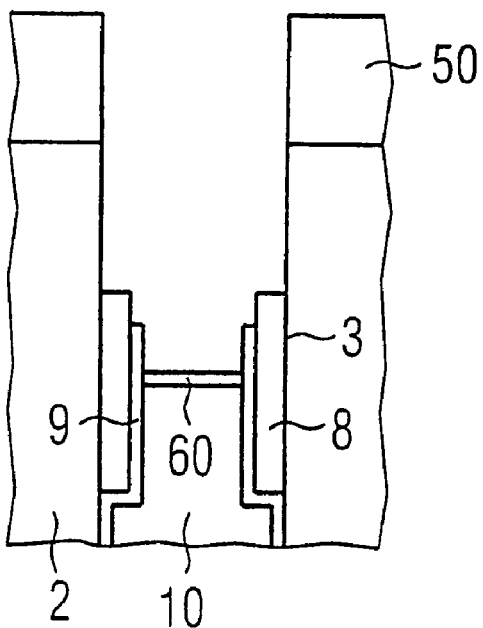

A further method variant, which follows after FIG. 3F, is illustrated in FIG. 3H. A resist filling 64 is filled into the trench 3 and etched back. That part of the dielectric layer 9 that is not protected by the resist filling 64 is subsequently moved and the resist filling 64 is subsequently removed.

Afterwards, respective method steps in accordance with FIGS. 4 to 20 together with associated description are carried out.

Figure 7:
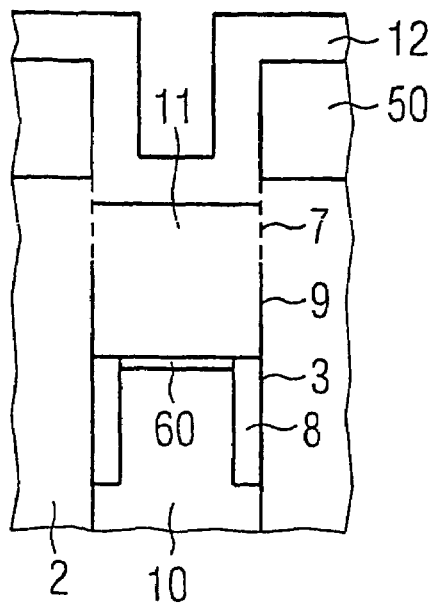
FIGS. 7, 8 and 9 are sectional views showing successive fabrication steps of the memory cell proceeding from FIG. 6.

With reference to FIG. 7, a second dielectric layer 12 is deposited. The second dielectric layer 12 is, for example, a silicon nitride layer applied by a CVD process. The second dielectric layer 12 is deposited conformally, for example.

Figure 8:
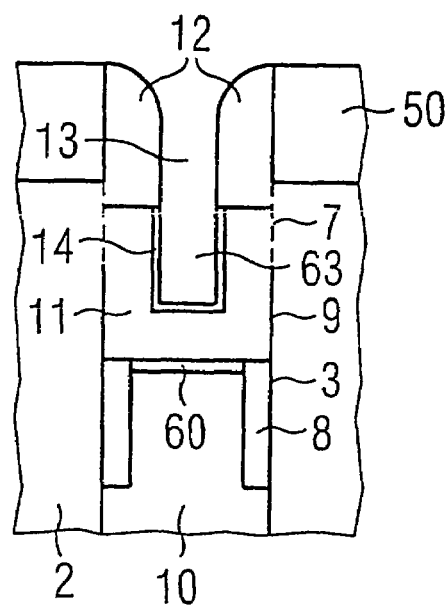

With reference to FIG. 8, an anisotropic silicon nitride etching is carried out, so that the second dielectric layer 12 is removed from the hard mask 50 and remains at least as a lateral edge web (spacer) in the upper region 6 of the trench 3. The second dielectric layer 12 has an inner opening 13. A silicon etching is subsequently carried out, during which the second dielectric layer 12 is used as an etching mask. The silicon etching etches a second trench 63 into the epitaxially grown layer 11. A lower doping region 18 and an upper doping region 19 can then be introduced by implantation. A third dielectric layer 14 is subsequently formed on the epitaxially grown layer 11 in the second trench 63. This can be carried out by thermal oxidation, for example. The third dielectric layer 14 later serves as a gate oxide.

Figure 9:
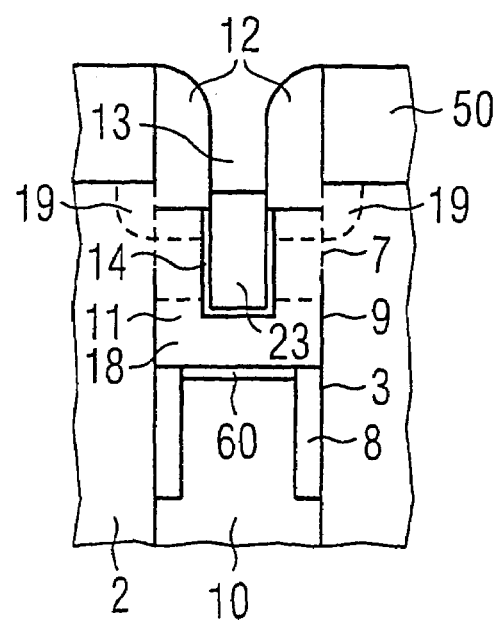

The lower doping region 18 and the upper doping region 19 are additionally illustrated in FIG. 9. After the implantation of these regions, they can be activated by a thermal step. A gate electrode 23 is subsequently formed on the substrate surface. The gate electrode 23 is usually highly doped polycrystalline silicon. In a subsequent chemical mechanical polishing (CMP) process, the gate electrode 23 is removed from the surface of the substrate and remains at least in the trench 3 above the third dielectric layer 14.

Figure 10:
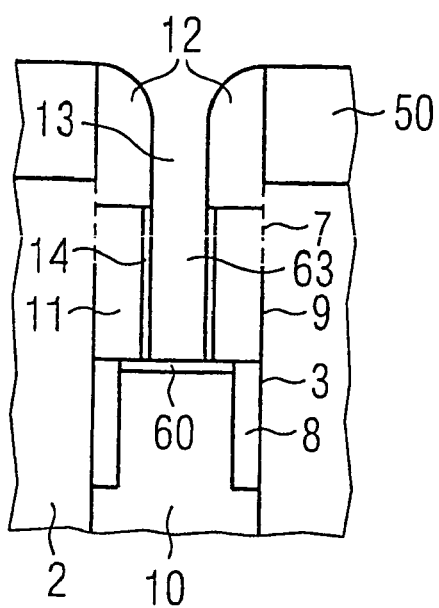
FIGS. 10 and 11 are sectional views showing a second variant of fabrication steps of the memory cell, proceeding from FIG. 7.
Figure 11:
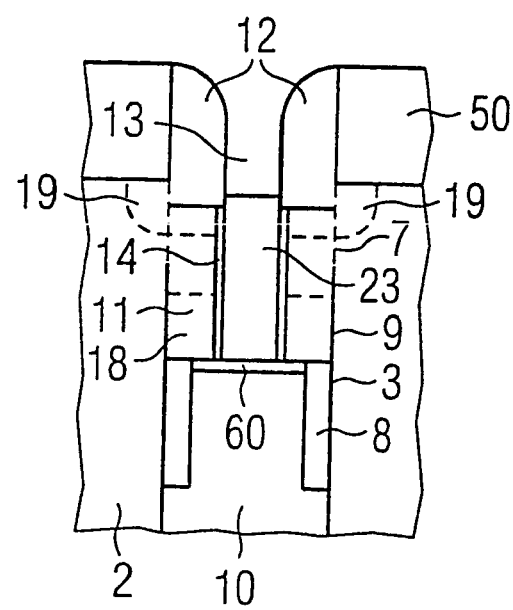

With reference to FIG. 10, a process variant that follows after FIG. 7 is illustrated. First, an anisotropic silicon nitride etching is carried out, so that the second dielectric layer 12 is removed from the hard mark 50 and remains at least as a lateral edge web in the upper region 6 of the trench 3. In this case, the second dielectric layer 12 has an inner opening 13. In contrast to FIG. 8, in this case the subsequent etching of the epitaxially grown layer 11 is carried out in such a way that the second trench 63 formed in the process extends as far as the barrier layer 60. Afterwards, implantations are likewise carried out for the purpose of forming the lower doping region 18 and the upper doping region 19. Furthermore, the third dielectric layer 14 is formed as a gate oxide. The gate electrode 23 is subsequently formed by the method steps already described above (FIG. 11).

Figure 12:
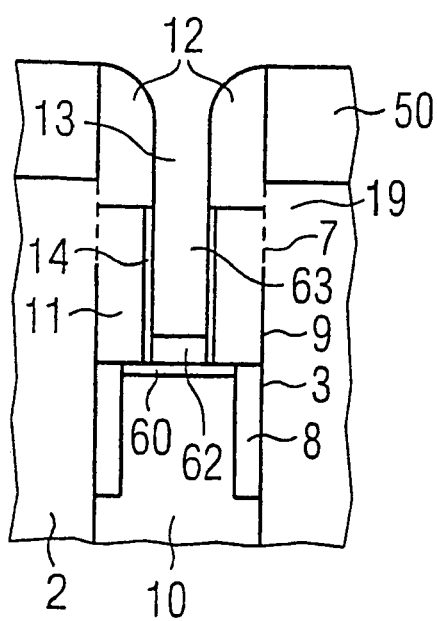
FIGS. 12 and 13 are sectional views showing a further variant with fabrication steps of the memory cell, proceeding from FIG. 7.

With reference to FIG. 12, a further process variant that follows after FIG. 10 is illustrated. In this case, the trench bottom insulation 62 is additionally formed in the second trench 63. In this case, the trench bottom insulation 62 has the advantage that a subsequently introduced gate electrode 23 is insulated from the conductive trench filling 10. In order to form the trench bottom insulation 62, by way of example, a conformal oxide layer is deposited, so that the second trench 63 is filled with silicon oxide. Afterwards, the silicon oxide layer is removed from the surface of the hard mask 50 by a CMP process and the silicon oxide is sunk into the second trench 63 by a sinking process, thereby producing the trench bottom insulation 62.

Figure 13:
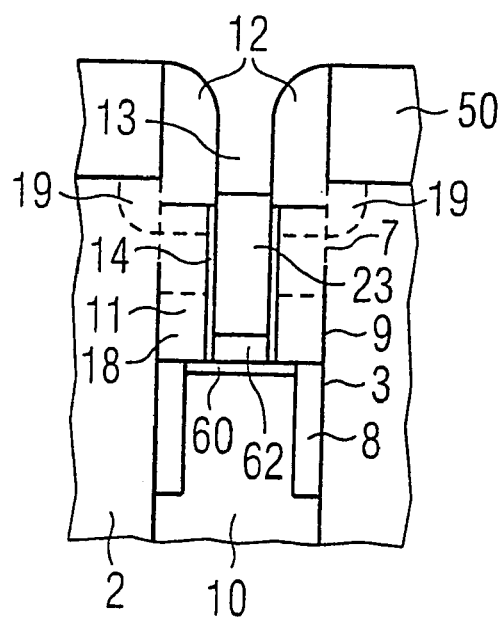

With reference to FIG. 13, the gate electrode 23 is fabricated in accordance with the methods described above.

Figure 14:
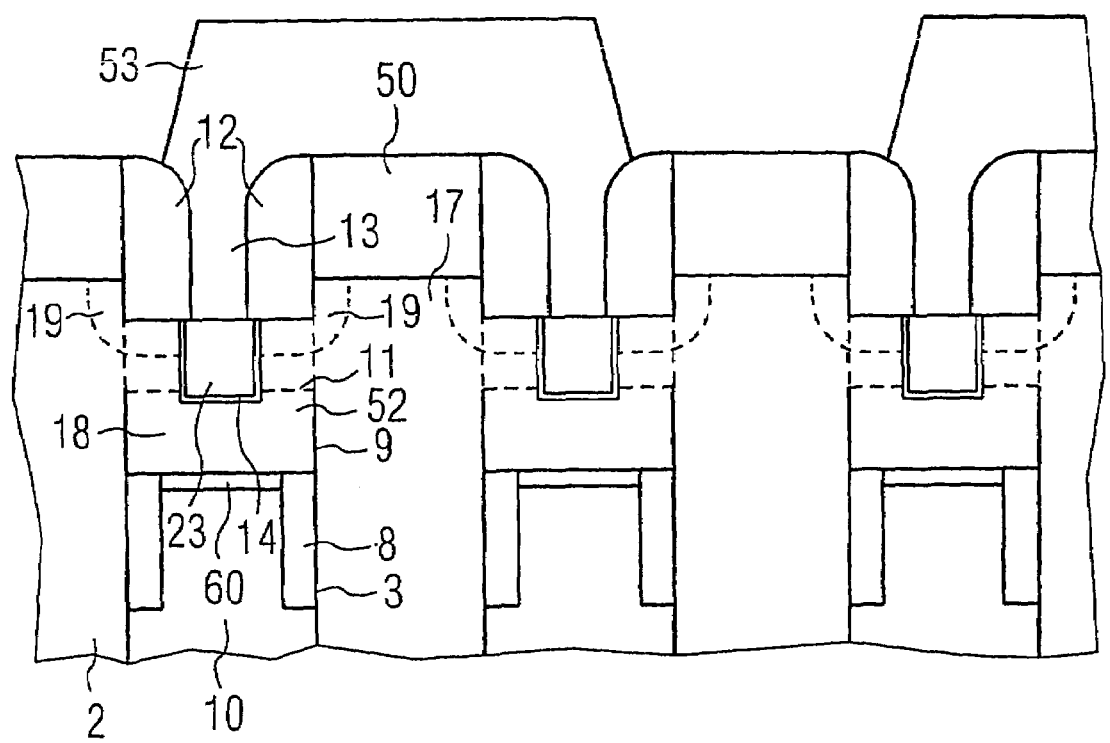
FIG. 14 to FIG. 20 are sectional views showing successive fabrication steps of a trench capacitor subsequent to FIG. 9, 11 or 13.

With reference to FIG. 14, a mask 53 is deposited on the substrate and patterned, so that parts of the underlying structure are uncovered. In this case, the mask 53 is positioned in such a way that it covers an active region 17 to be formed and leaves free those regions of the surface in which an isolation trench 15 is later formed. It is particularly advantageous here to choose the opening in the mask 53 in such a way that the second dielectric layer 12 is at least partly uncovered. The advantage is that the width of the lateral spacer web of the second dielectric layer 12 is available as alignment tolerance. Further alignment tolerance for the formation of the active regions is achieved by filling the inner opening 13 with planarizing material beforehand. After the opening of a thin covering layer with the mask 53, a subsequent nitride etching can be performed selectively with respect to the planarizing material. By way of example, an antireflection layer (ARC) is suitable as planarizing material. As a result, the entire cross-sectional area of the trench 3 is available as alignment tolerance.

Figure 15:
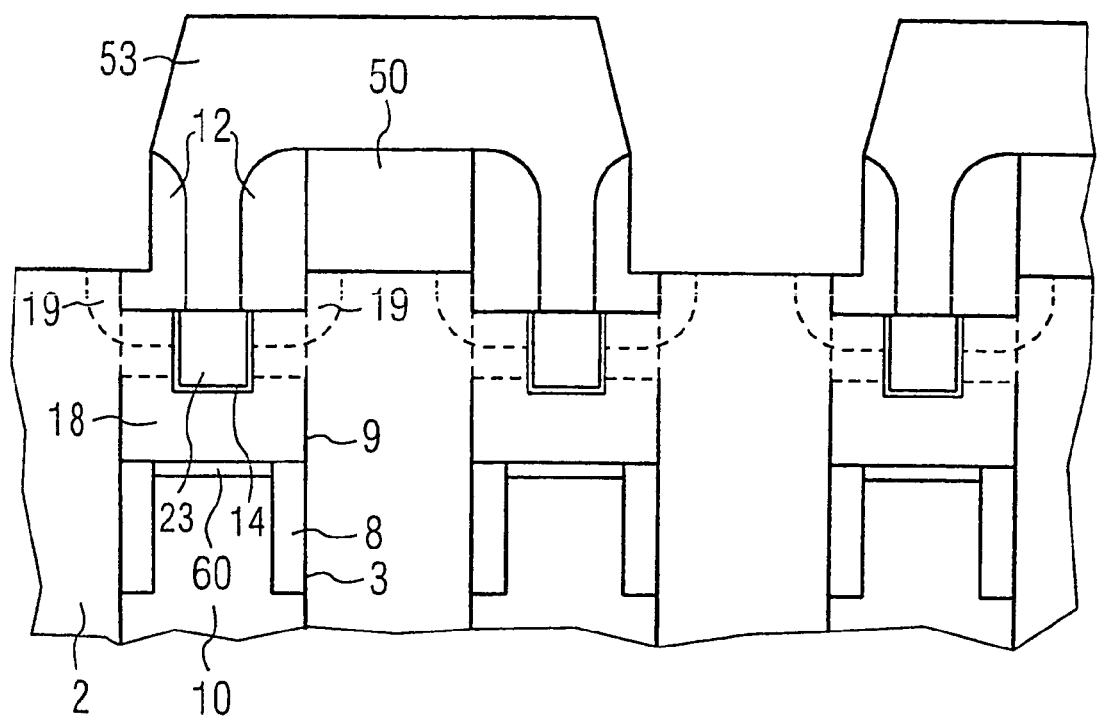

With reference to FIG. 15, a first etching step for forming the isolation trench is carried out.

Figure 16:
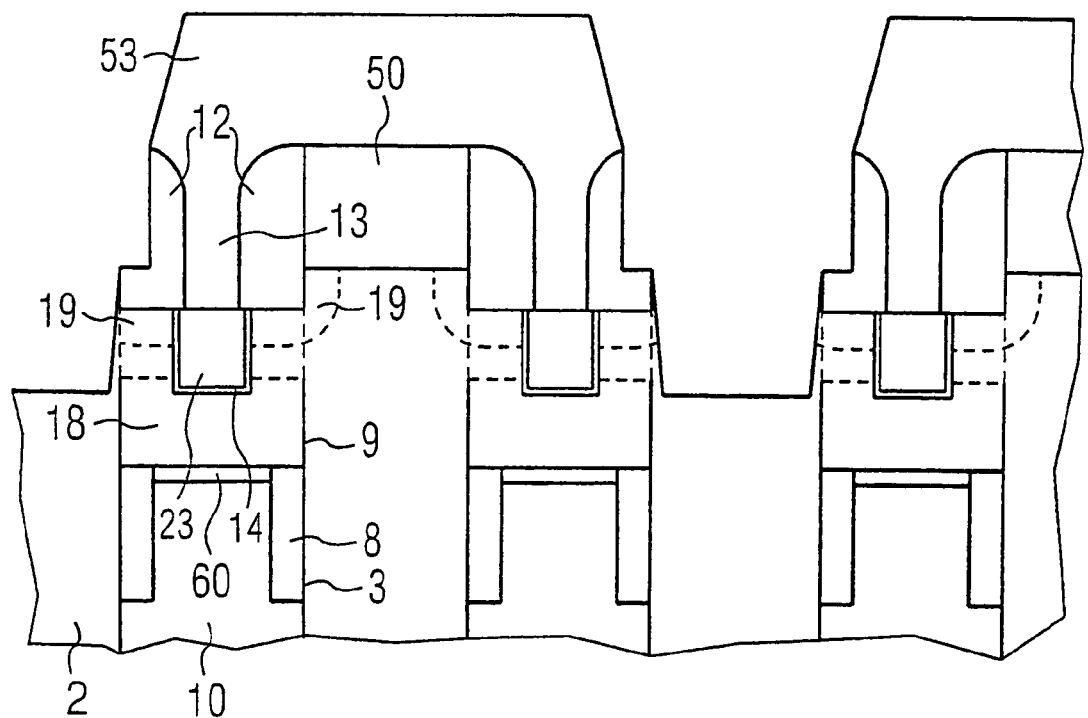

With reference to FIG. 16 a second etching step for forming the isolation trenches is carried out, the etching step being carried out selectively with respect to the material of the second dielectric layer 12, which is formed from silicon nitride in this case. This method ensures that the isolation trench 15 is formed in a self-aligned manner between adjacent trenches.

Figure 17:
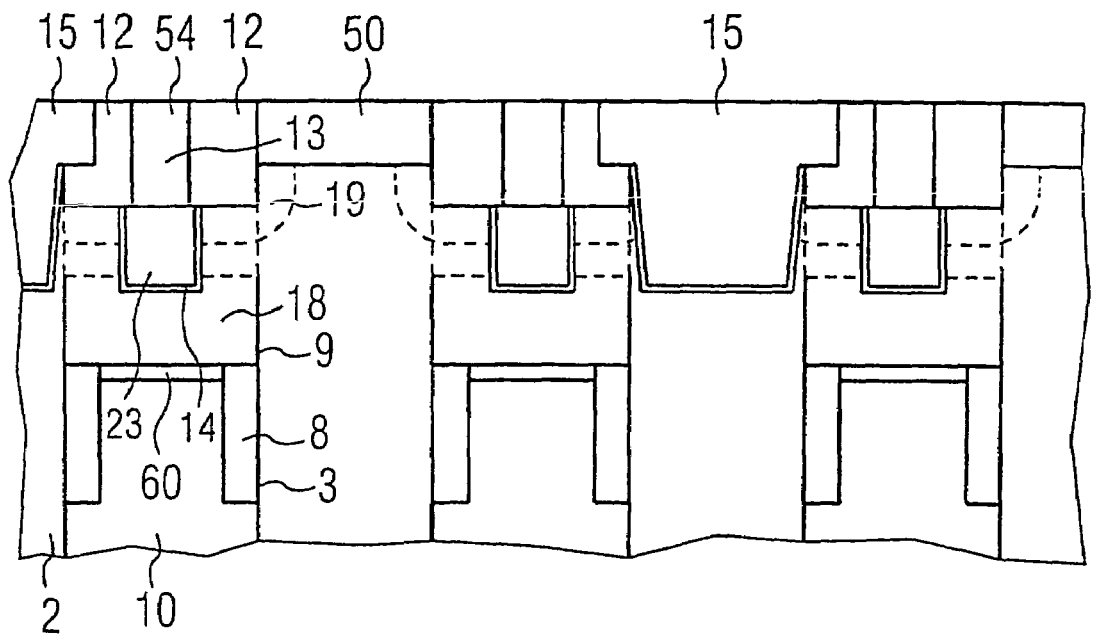

With reference to FIG. 17, in a subsequent process, the mask 53 is removed from the substrate surface and, optionally, the planarizing material is removed from the opening 13, a thermal oxidation of the opened isolation trenches is carried out and an oxide—for example an high density plasma (HDP) oxide—is subsequently deposited, which forms the isolation trenches 15 and forms an oxide filling 54 in the inner opening 13 of the second dielectric layer 12. Afterwards, the surface is planarized by a CMP process and the hard mask 50 is removed from the substrate surface.

Figure 18:
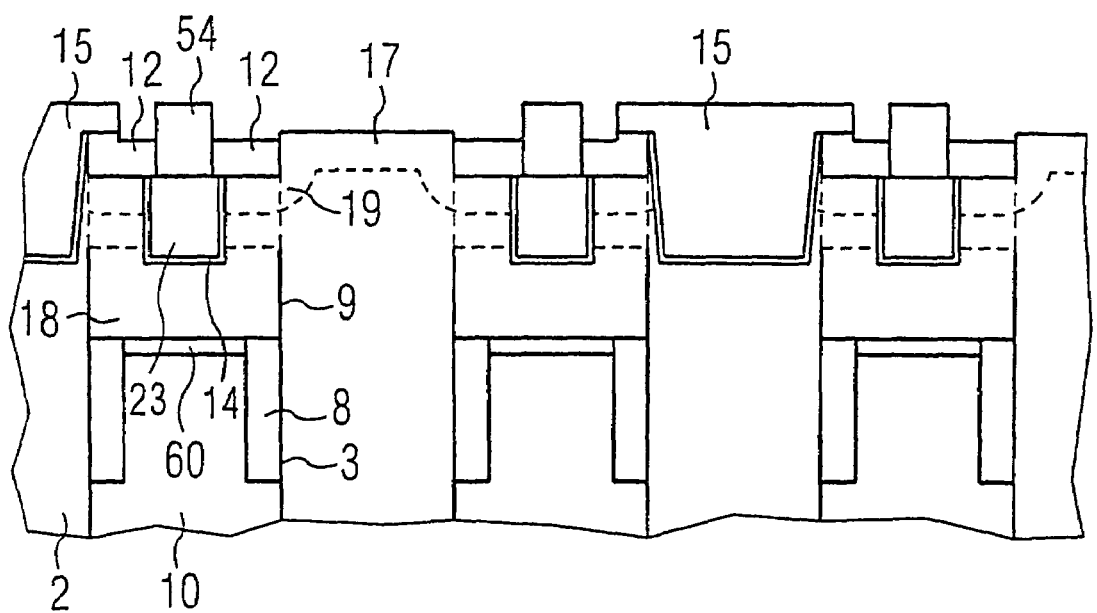

With reference to FIG. 18, the second dielectric layer 12 is sunk. The removal of the hard mask can likewise by carried out in this step, since the hard mask So and the second dielectric layer 12 are composed of silicon nitride, which can be etched selectively by hot phosphoric acid. Afterwards, a sacrificial oxide layer is grown thermally, which serves as a screen oxide during a subsequent implantation of the active region 17. A doping by gas phase doping, plasma doping (PLAD) or plasma ion immersion implantation (PIII) is likewise possible. After the doping, the sacrificial oxide is removed and the surface of the active region 17 can optionally be cleaned by a thermal oxide being grown and removed by hydrofluoric acid.

Figure 19:
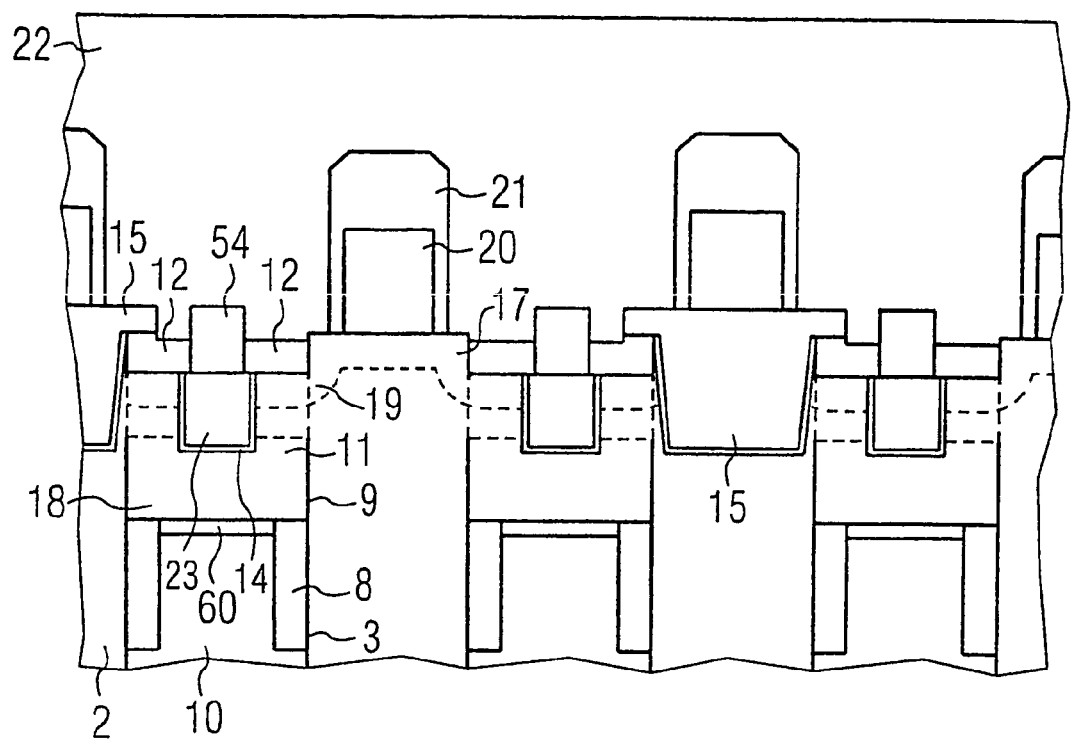

With reference to FIG. 19, a bit line 20 is formed on the substrate surface, so that the bit line 20 runs partly on the isolation trench 15 and partly on the active region 17. With the bit line 20, the active region 17 and thus the upper doped region 19 is connected to the bit line. Afterwards, a dielectric encapsulation 21 is formed around the bit line 20 in order to insulate the latter. Furthermore, a glass layer 22 is formed on the substrate 2, which glass layer is usually composed of a highly doped silicate glass. Optionally, a nitride-containing CVD layer, serving as a diffusion barrier to the substrate, may be deposited before the glass layer 22. The glass layer 22 serves for planarization since the highly doped silicate glass is flowable at temperatures around 400 to 500° C.

Figure 20:
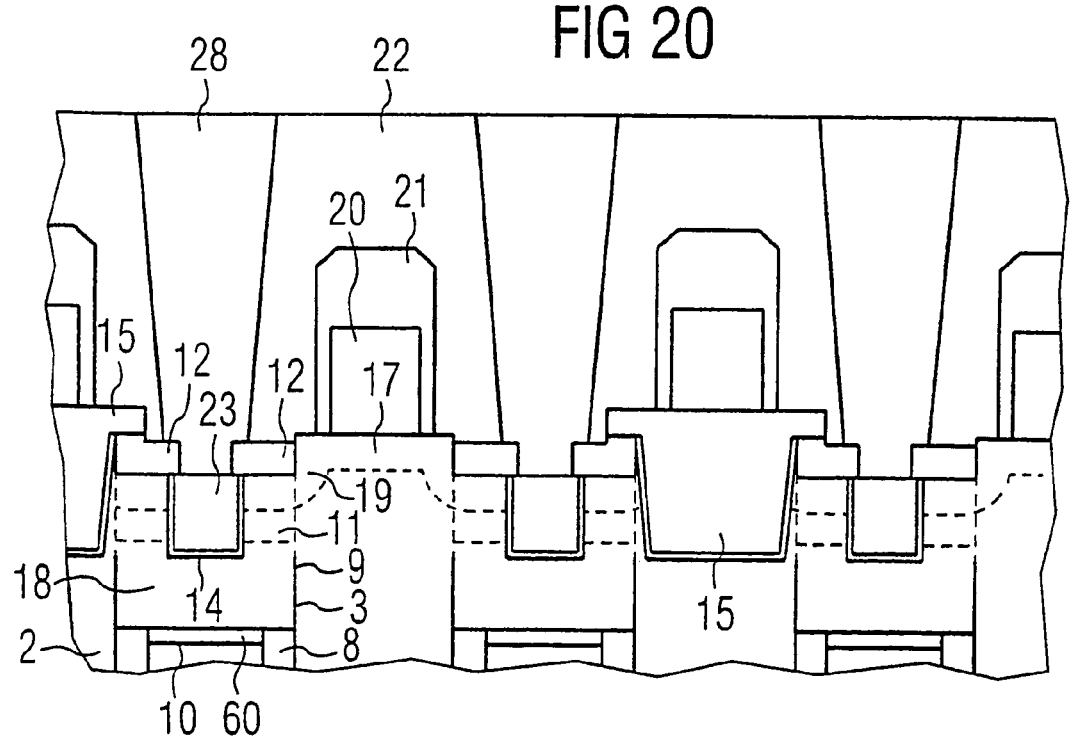

With reference to FIG. 20, a mask for the etching of the word lines and of the contact hole for the gate terminal is patterned in a photolithographic step. The subsequent etching process etches the doped silicate glass in the region not covered by the mask and is selective with respect to silicon nitride, so that the gate terminal 28 is formed in a self-aligned manner between the bit lines 21 and the inner opening of the second dielectric layer 12 is automatically uncovered. The gate electrode 23 is uncovered during this step. The gate electrode 23 is connected to a word line 24 by a conductive material 28.

Figure 21:
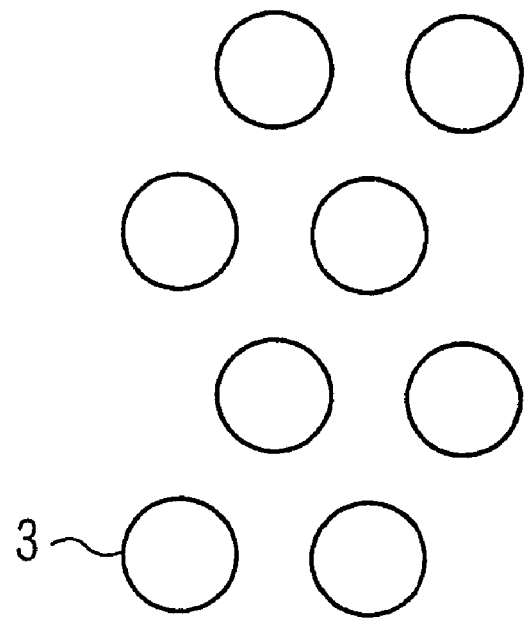
FIG. 21 is a plan view of a configuration of trenches.

FIG. 21 shows the hexagonal configuration of storage trenches. The trench 3 is likewise illustrated. The hexagonal configuration is particularly favorable since it reduces imaging errors in the lithographic exposure.

Figure 22:
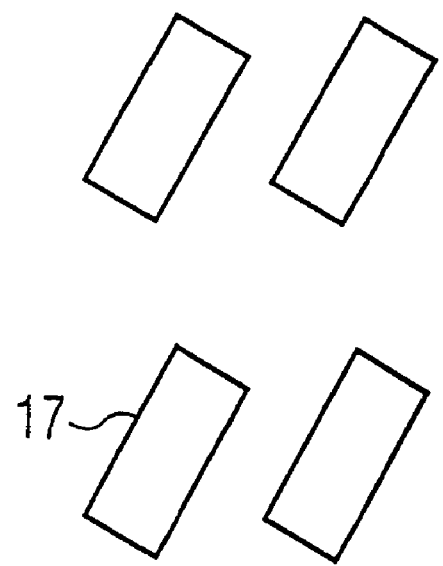
FIG. 22 is a plan view of a configuration of active regions.

In FIG. 22, a mask for forming the active regions is illustrated and the active region 17 is marked.

Figure 23:
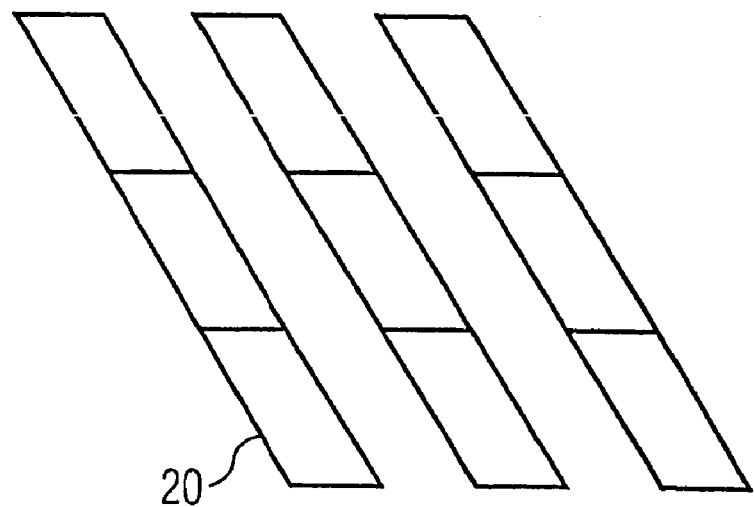
FIG. 23 is a plan view of a configuration of bit lines.

FIG. 23 illustrates a first course of bit lines, the bit line 20 running parallel to the rest of the bit lines.

Figure 24:
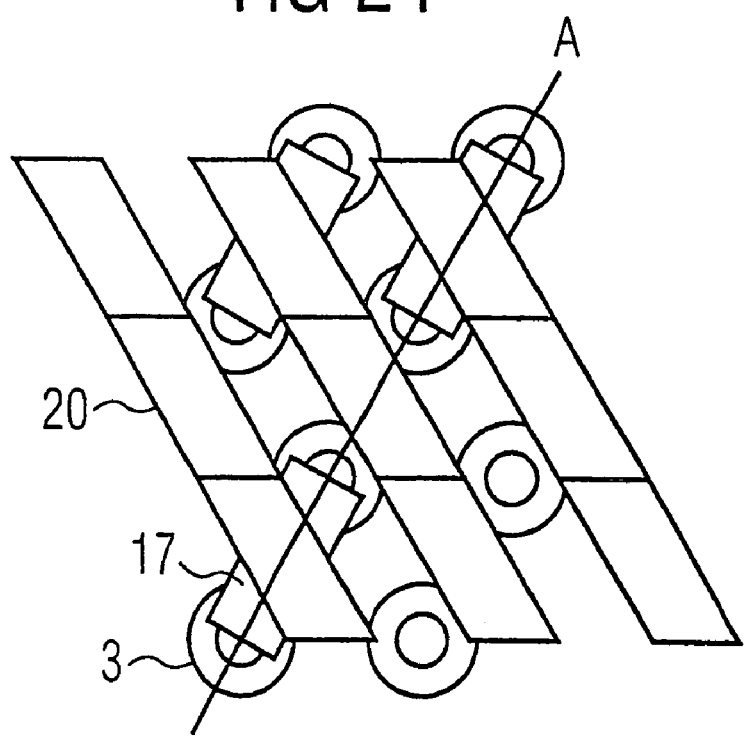
FIG. 24 is a plan view of a configuration of memory cells.

FIG. 24 illustrates the combination of FIGS. 21, 22, and 23 with different superpositions in order to indicate the situation better, in each case two trenches being connected by an active region 17 and the bit line 20 running partly over the active region 17 and partly over the isolation trench 15.

Figure 25:
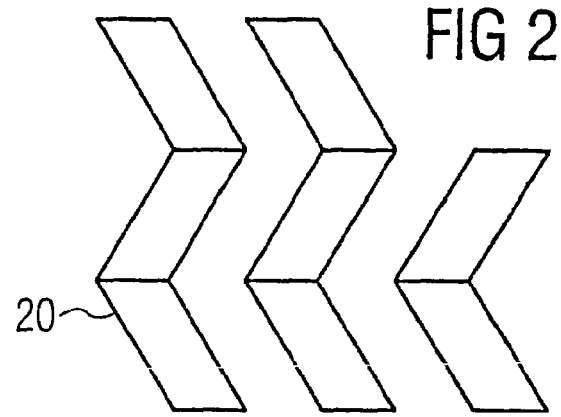
FIG. 25 is a plan view of a further configuration of bit lines.

FIG. 25 shows a further exemplary embodiment of a bit line configuration, the bit line 20 being disposed in a zigzag pattern.

Figure 26:
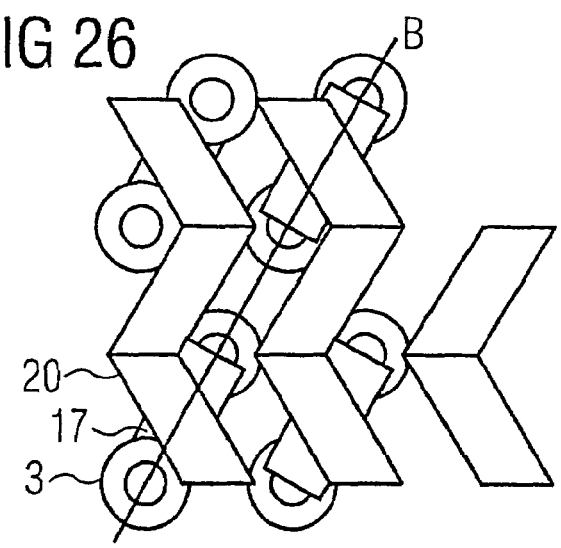
FIG. 26 is a plan view of a configuration of memory cells.

The combination of FIGS. 21, 22 and 25 is illustrated with reference to FIG. 26. The trench 3 is connected with the active region 17 to an adjacent trench and is surrounded by the isolation trench 15. Furthermore, the course of the bit line 20 is illustrated, which again runs partly over the active region 17 and over the isolation trench 15. Furthermore, FIG. 24 illustrates a sectional line A that cuts the active regions 17 in the longitudinal direction.

Figure 27:
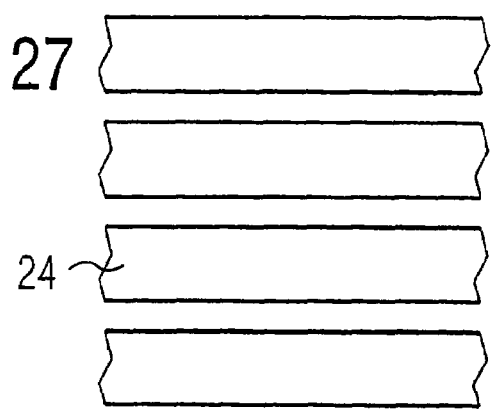
FIG. 27 is a plan view of a configuration of word lines.

FIG. 27 illustrates the course of the word lines.

One advantage of the invention is that a silicon nitride cover with the inner opening 13 is fabricated in the trench 3 above the vertical transistor. In order to illustrate the situation, FIGS. 24 and 26 each depict the inner opening 13 in a number of trenches by way of example. Since the bit lines are encapsulated by the dielectric encapsulation 21, for example, it is possible to form the contact to the gate electrode 23 in a self-aligned manner when forming the gate terminal 28 between the bit lines and through the inner opening 13. Furthermore, it is advantageous according to the invention for the trench 3 not to be disposed below the crossover of word line and bit line but rather slightly offset with respect thereto.

A particular advantage of the method according to the invention consists in the increased alignment tolerance, which is made possible by the self-aligned process of the gate terminal fabrication. As a result, it is possible to connect the word line to the gate electrode.

A further advantage of the invention is that the inner opening 13 is opened in a self-aligned manner from above and the gate terminal 28 is contact-connected in a self-aligned manner. As a result, it is possible to embody the trench with a larger diameter than the minimum structure width, in order thus to increase the capacitance of the trench.

A further advantage of the method according to the invention is that the gate oxide does not grow from the trench 3, but rather is only formed on the epitaxially grown layer 11 in the second trench 63. A further advantage of the method according to the invention is that the upper-doped region 19 is connected to the active region 17. Furthermore, the bit line 20 runs on the active region 17 and adjoins the latter.

A further advantage of the method according to the invention is that the bit line is surrounded by an insulation encapsulation. It is particularly advantageous here to form the dielectric encapsulation 21 from silicon nitride, since this can be used as an etching mask during subsequent oxide patterning processes.

A further advantage of the method according to the invention forms the word line 24 above the bit line 20, as a result of which the coupling capacitance between the word line and bit line is kept low and the total capacitance of the bit line is likewise low, which enables reliable reading from the memory cell.

Furthermore, it is advantageous to provide the storage trenches 3 in a hexagonal configuration, as a result of which the substrate surface is optimally utilized and the capacitance of the trench capacitor can be increased.

It is optionally possible to provide a buried plate as the counter electrode of the trench capacitor. To that end, by way of example, during the formation of the trench capacitor dopant is diffused into the substrate from the trench 3 filled with a doped material. Furthermore, it is possible to provide a buried well (buried layer) which connects the buried plates of adjacent trench capacitors.

We claim:

1. A method for fabricating a memory cell, which comprises the steps of:
   providing a substrate;
   forming a trench in the substrate, the trench having a lower region, a central region, an upper region, and an inner wall;
   subsequently forming an insulation collar in the central region on the inner wall of the trench;
   forming a dielectric layer at least in the lower region of the trench;
   forming a conductive trench filling in the lower region of the trench on the dielectric layer and at least partly in the central region of the trench on the insulation collar;
   forming a barrier layer on the conductive trench filling by thermally growing a thermal silicon nitride, a thermal silicon oxide, or a thermal silicon oxynitride and the conductive trench filing being completely covered by the barrier layer; and
   growing epitaxially a layer in the upper region of the trench, on the inner wall of the trench, and on the conductive trench filling, the barrier layer being overgrown laterally, proceeding from the inner wall of the trench, during epitaxial growing of the layer, the barrier layer serving as a barrier with respect to impurities and dislocations migrating from the conductive trench filing into the epitaxially grown layer, and simultaneously the barrier layer allowing transmission of electric charges stored in the conductive trench filing.

2. The method according to claim 1, which further comprises forming a further dielectric layer with an inner opening formed therein in the upper region of the trench above the epitaxially grown layer.

3. The method according to claim 2, which further comprises:
forming a further trench in the epitaxially grown layer, the further dielectric layer being used as an etching mask during a formation of the further trench; and
forming an additional dielectric layer on a sidewall of the further trench.

4. The method according to claim 3, which further comprises:
forming a gate electrode on the additional dielectric layer in the further trench, the gate electrode reaching at least as far as the inner opening of the further dielectric layer.

5. The method according to claim 4, which further comprises:
forming a glass layer above the substrate;
etching an additional trench in the glass layer, said additional trench uncovering the inner opening of the further dielectric layer and uses the further dielectric layer as an etching mask for etching free the inner opening until the gate electrode is uncovered; and
forming a self-aligned gate terminal in the additional trench.

6. The method according to claim 1, which further comprises:
forming a closing joint in the epitaxially grown layer; and
annealing the closing joint in a thermal step at a temperature of between 900° C. and 1200° C.

7. A method for fabricating a memory cell, which comprises the steps of:
providing a substrate;
forming a trench in the substrate, the trench having a lower region, a central region, an upper region, and an inner wall;
subsequently forming an insulation collar in the central region on the inner wall of the trench;
forming a dielectric layer at least in the lower region of the trench;
forming a conductive trench filling in the lower region of the trench on the dielectric layer and at least partly in the central region of the trench on the insulation collar;
forming a barrier layer on the conductive trench filling by doping the conductive trench filling and the conductive trench filing being completely covered by the barrier layer; and
growing epitaxially a layer in the upper region of the trench, on the inner wall of the trench, and on the conductive trench filling, the barrier layer being overgrown laterally, proceeding from the inner wall of the trench, during epitaxial growing of the layer, the barrier layer serving as a barrier with respect to impurities and dislocations migrating from the conductive trench filing into the epitaxially grown layer, and simultaneously the barrier layer allowing transmission of electric charges stored in the conductive trench filing.

8. The method according to claim 7, which further comprises forming a further dielectric layer with an inner opening formed therein in the upper region of the trench above the epitaxially grown layer.

9. The method according to claim 8, which further comprises:
forming a further trench in the epitaxially grown layer, the further dielectric layer being used as an etching mask during a formation of the further trench; and
forming an additional dielectric layer on a sidewall of the further trench.

10. The method according to claim 9, which further comprises:
forming a gate electrode on the additional dielectric layer in the further trench, the gate electrode reaching at least as far as the inner opening of the further dielectric layer.

11. The method according to claim 10, which further comprises:
forming a glass layer above the substrate;
etching an additional trench in the glass layer, the additional trench uncovering the inner opening of the further dielectric layer and using the further dielectric layer as an etching mask for etching free the inner opening until the gate electrode is uncovered; and
forming a self-aligned gate terminal in the additional trench.

12. The method according to claim 7, which further comprises;
forming a closing joint in the epitaxially grown layer; and
annealing the closing joint in a thermal step at a temperature of between 900° C. and 1200° C.

13. A method for fabricating a memory cell, which comprises the steps of:
providing a substrate;
forming a trench in the substrate, the trench having a lower region, a central region, an upper region, and an inner wall;
subsequently forming an insulation collar in the central region on the inner wall of the trench;
forming a dielectric layer at least in the lower region of the trench;
forming a conductive trench filling with underlying polysilicon and in the lower region of the trench on the dielectric layer and at least partly in the central region of the trench on the insulation collar;
forming a barrier layer on the conductive trench filling by depositing a metal layer and subsequently performing a silicidizing step on the metal layer with respect to the underlying polysilicon of the conductive trench filing and the conductive trench filing being completely covered by the barrier layer; and
growing epitaxially a layer in the upper region of the trench, on the inner wall of the trench, and on the conductive trench filling, the barrier layer being overgrown laterally, proceeding from the inner wall of the trench, during epitaxial growing of the layer, the barrier layer serving as a barrier with respect to impurities and dislocations migrating from the conductive trench filing into the epitaxially grown layer, and simultaneously the barrier layer allowing transmission of electric charges stored in the conductive trench filing.

14. The method according to claim 13, which further comprises forming a further dielectric layer with an inner opening formed therein in the upper region of the trench above the epitaxially grown layer.

15. The method according to claim 14, which further comprises:
forming a further trench in the epitaxially grown layer, the further dielectric layer being used as an etching mask during a formation of the further trench; and
forming an additional dielectric layer on a sidewall of the further trench.

16. The method according to claim 15, which further comprises:
forming a gate electrode on the additional dielectric layer in the further trench, the gate electrode reaching at least as far as the inner opening of the further dielectric layer.

17. The method according to claim 16, which further comprises:
   forming a glass layer above the substrate;
   etching an additional trench in the glass layer, the additional trench uncovering the inner opening of the further dielectric layer and using the further dielectric layer as an etching mask for etching free the inner opening until the gate electrode is uncovered; and
   forming a self-aligned gate terminal in the additional trench.

18. The method according to claim 13, which further comprises:
   forming a closing joint in the epitaxially grown layer; and
   annealing the closing joint in a thermal step at a temperature of between 900° C. and 1200° C.

* * * * *